US010483171B2

(12) United States Patent
Moroz (10) Patent No.: US 10,483,171 B2
(45) Date of Patent: *Nov. 19, 2019

(54) METHOD AND APPARATUS WITH CHANNEL STOP DOPED DEVICES

(71) Applicant: Synopsys, Inc., Mountain View, CA (US)

(72) Inventor: Victor Moroz, Saratoga, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/918,236

(22) Filed: Mar. 12, 2018

(65) Prior Publication Data

US 2018/0226301 A1  Aug. 9, 2018

Related U.S. Application Data

(63) Continuation of application No. 13/693,906, filed on Dec. 4, 2012, now Pat. No. 9,917,018.

(51) Int. Cl.
| | |
|---|---|
| *H01L 21/8238* | (2006.01) |
| *H01L 21/762* | (2006.01) |
| *G06F 17/50* | (2006.01) |

(52) U.S. Cl.
CPC ........ *H01L 21/823878* (2013.01); *H01L 21/76213* (2013.01); *G06F 17/5068* (2013.01); *H01L 21/823821* (2013.01)

(58) Field of Classification Search
CPC ....... H01L 21/823878; H01L 21/76213; H01L 21/823821; G06F 17/5068
See application file for complete search history.

(56) References Cited

U.S. PATENT DOCUMENTS

| | | | |
|---|---|---|---|
| 5,073,509 | A | 12/1991 | Lee |
| 5,139,966 | A | 8/1992 | Jerome et al. |
| 5,358,882 | A | 10/1994 | Bertagnolli et al. |
| 5,439,835 | A | 8/1995 | Gonzalez |
| 5,468,676 | A | 11/1995 | Madan |
| 5,643,825 | A | 7/1997 | Gardner et al. |
| 6,144,076 | A | 11/2000 | Puchner et al. |
| 6,472,712 | B1 | 10/2002 | Nakura et al. |
| 6,881,641 | B2 | 4/2005 | Wieczorek et al. |
| 6,967,380 | B2 | 11/2005 | Breitwisch et al. |
| 7,009,250 | B1 | 3/2006 | Mouli |
| 8,614,128 | B1 | 12/2013 | Thompson et al. |

(Continued)

FOREIGN PATENT DOCUMENTS

| | | |
|---|---|---|
| KR | 10-0311498 B1 | 11/2001 |
| KR | 10-2006-0035746 A | 4/2006 |

OTHER PUBLICATIONS

International Search Report dated Mar. 31, 2014 for International Application No. PCT/US2013/073111.

(Continued)

*Primary Examiner* — Syed I Gheyas
(74) *Attorney, Agent, or Firm* — Haynes Beffel & Wolfeld LLP (57) ABSTRACT

Methods and apparatuses relate to implanting a surface of a semiconductor substrate with dopants, making undoped semiconductor material directly on the surface implanted with the dopants, and making a transistor with a transistor channel in the undoped semiconductor material, such that the transistor channel of the transistor remains undoped throughout manufacture of the integrated circuit.

23 Claims, 8 Drawing Sheets

(56) References Cited

U.S. PATENT DOCUMENTS

| | | |
|---|---|---|
| 9,917,018 B2 | 3/2018 | Moroz |
| 2003/0201498 A1 | 10/2003 | Hu |
| 2012/0025316 A1 | 2/2012 | Schultz |
| 2012/0119309 A1 | 5/2012 | Horita |

OTHER PUBLICATIONS

U.S. Appl. No. 13/693,906—Office Action dated Jun. 22, 2016, 28 pages.
U.S. Appl. No. 13/693,906—Final Office Action dated Nov. 1, 2016, 41 pages.
U.S. Appl. No. 13/693,906—Advisory Action dated Jan. 20, 2017, 3 pages.
U.S. Appl. No. 13/693,906—Office Action dated Jun. 16, 2017, 45 pages.
U.S. Appl. No. 13/693,906—Notice of Allowance dated Nov. 2, 2017, 30 pages.
U.S. Appl. No. 13/693,906—Office Action dated Jul. 3, 2013, 29 pages.
U.S. Appl. No. 13/693,906—Response to Office Action dated Jul. 3, 2013, filed Oct. 3, 2013, 11 pages.
U.S. Appl. No. 13/693,906—Final Office Action dated Nov. 26, 2013, 27 pages.
U.S. Appl. No. 13/693,906—Final Office Action dated May 16, 2014, 19 pages.
U.S. Appl. No. 13/693,906—Response to Final Office Action filed Sep. 30, 2014, 13 pages.
U.S. Appl. No. 13/693,906—Office Action dated Jun. 29, 2015, 28 pages.
U.S. Appl. No. 13/693,906—Response to Office Action filed Dec. 23, 2015, 7 pages.
U.S. Appl. No. 13/693,906—Final Office Action dated Mar. 4, 2016, 7 pages.
U.S. Appl. No. 13/693,906—Response to Final Office Action filed May 4, 2016, 15 pages.
U.S. Appl. No. 13/693,906—Response to Office Action filed Sep. 8, 2016, 13 pages.
U.S. Appl. No. 13/693,906—Response to Final Office Action filed Dec. 23, 2016, 12 pages.

METHOD AND APPARATUS WITH CHANNEL STOP DOPED DEVICES

PRIORITY CLAIM

This application is a continuation of U.S. patent application Ser. No. 13/693,906, filed 4 Dec. 2012 now U.S. Pat. No. 9,917,018, issued 13 Mar. 2018, and is incorporated herein by reference.

BACKGROUND

Field

The present technology relates to methods and apparatuses for channel stop doping, which can decrease the effect of parasitic transistors and improve the current of small dimension transistors.

Description of Related Art

Small dimension transistors such as finFETs and planar transistors are particularly sensitive to changes in the density of dopants in the transistor channel. Accordingly, a fabrication goal is to decrease or eliminate dopants in the transistor channel.

One approach is to form shallow trench isolation (STI) oxide regions, and then perform high implant energy implants through the semiconductor surface to form the n-wells and p-wells. However, such an approach has the side effect of undesirable channel doping in the surface of the semiconductor, which runs counter to the original goal of decreasing or eliminating dopants in the transistor channel. Such an approach also fails to have abrupt doping junctions between the lightly doped or undoped channel, and the moderately to heavily doped semiconductor material underlying the channel.

SUMMARY

Various embodiments are directed to channel stop doping.

One aspect of the technology is a method of performing channel stop doping in an integrated circuit, comprising:
  implanting a surface of a semiconductor substrate with dopants;
  making undoped semiconductor material directly on the surface implanted with the dopants; and
  making a transistor with a transistor channel in the undoped semiconductor material, such that the transistor channel of the transistor remains undoped throughout manufacture of the integrated circuit.

Another aspect of the technology is a nontransitory computer readable medium with computer executable instructions determining a layout of an integrated circuit design. The computer executable instructions include:
  first computer executable instructions defining first layout locations for implanting a surface of a semiconductor substrate with dopants; and
  second computer executable instructions defining second layout locations making a transistor with a transistor channel in the undoped semiconductor material, the undoped semiconductor material directly on the surface implanted with the dopants, such that the transistor channel of the transistor remains undoped throughout manufacture of the integrated circuit.

Another aspect of the technology is a set of lithographic masks determining a layout of an integrated circuit design, including:
  a first lithographic mask defining first layout locations for implanting a surface of a semiconductor substrate with dopants; and
  a second lithographic mask defining second layout locations making a transistor with a transistor channel in the undoped semiconductor material, the undoped semiconductor material directly on the surface implanted with the dopants, such that the transistor channel of the transistor remains undoped throughout manufacture of the integrated circuit.

Another aspect of the technology is a computer system for laying out an integrated circuit design. The computer system comprises a processor and a memory, and generates a layout of the integrated circuit design that defines a plurality of masks. The computer system is configured to perform computer executable instructions comprising:
  first computer executable instructions defining first layout locations for implanting a surface of a semiconductor substrate with dopants; and
  second computer executable instructions defining second layout locations making a transistor with a transistor channel in the undoped semiconductor material, the undoped semiconductor material directly on the surface implanted with the dopants, such that the transistor channel of the transistor remains undoped throughout manufacture of the integrated circuit.

The various aspects of the technology have various embodiments.

In some embodiments, it is unnecessary to define layout locations for making the undoped semiconductor material directly on the surface implanted with the dopants. If both the NMOS and the PMOS channels are built with the same undoped semiconductor, such as Si, then the undoped semiconductor material can be grown on the entire chip, such that no mask is necessary.

In other embodiments, third layout locations are defined for making undoped semiconductor material directly on the surface implanted with the dopants. Different undoped semiconductors can be grown for the NMOS and the PMOS transistors, such as InGaAs and Ge. Such locations can be defined via computer executable instructions or a lithographic mask, where the computer executable instructions can be on a nontransitory computer readable medium, or on a computer system configured to perform the instructions.

In some embodiments, the transistor is a finFET or a planar transistor.

In some embodiments, the implanted dopants provide latchup protection of the transistor against other structures.

In some embodiments, the transistor is one of a plurality of transistors with the transistor channel in the undoped semiconductor material. The transistor channels of plurality of transistors share the same number of dopants.

Other aspects are directed to a computer readable medium storing computer instructions to perform a method of designing an integrated circuit, the method for use by a computer system having a processor and memory. The computer instructions are executable by the computer system to design the integrated circuit as described herein.

Other aspects are directed to a computer system designing an integrated circuit, comprising a processor and memory, configured to design an integrated circuit as described herein.

Other aspects are directed to a method of operating an integrated circuit as described herein.

DETAILED DESCRIPTION

Figure 1:
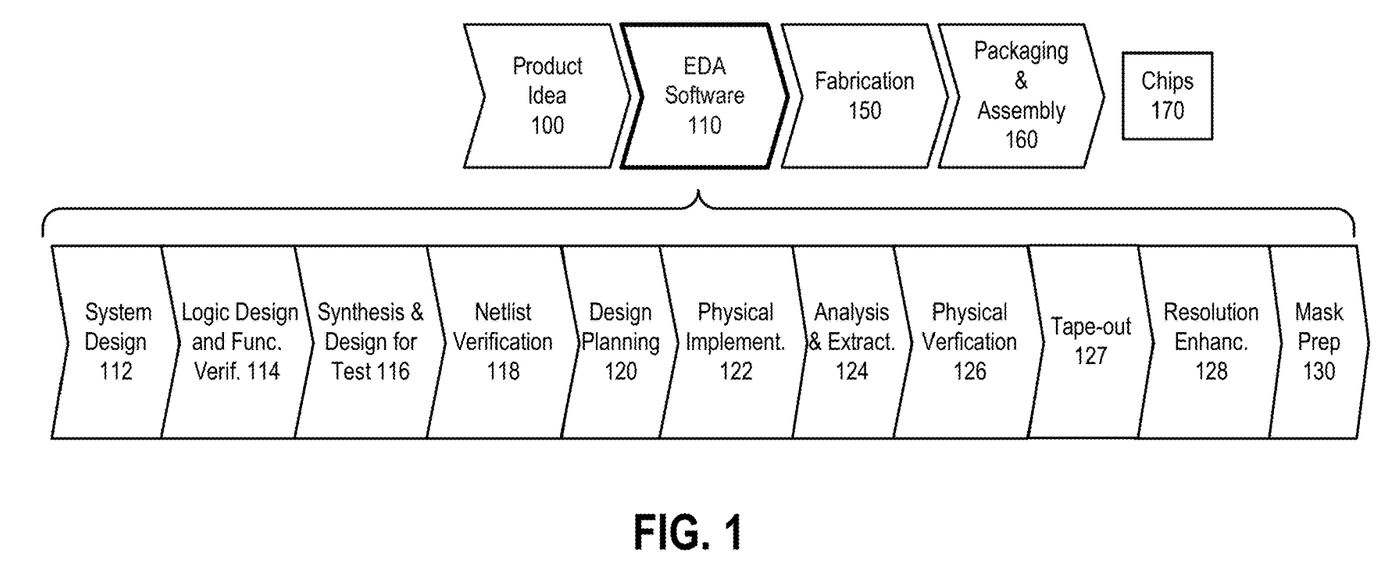
FIG. 1 shows a simplified representation of an illustrative integrated circuit design flow incorporating features of the technology.

FIG. 1 is a simplified representation of an integrated circuit design flow. As with all flowcharts herein, it will be appreciated that many of the steps of FIG. 1 can be combined, performed in parallel or performed in a different sequence without affecting the functions achieved. In some cases a rearrangement of steps will achieve the same results only if certain other changes are made as well, and in other cases a rearrangement of steps will achieve the same results only if certain conditions are satisfied.

At a high level, the process of FIG. 1 starts with the product idea (block 100) and is realized in an EDA (Electronic Design Automation) software design process (block 110). When the design is finalized, the fabrication process (block 150) and packaging and assembly processes (block 160) occur, ultimately resulting in finished integrated circuit chips (result 170).

The EDA software design process (block 110) is actually composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (block 110) will now be provided. The following stages reflect the improved device design using channel stop doping.

System design (block 112): The designers describe the functionality that they want to implement, they can perform what-if planning to refine functionality, check costs, etc. Hardware-software architecture selection can occur at this stage. Example EDA software products that have been available from Synopsys, Inc. that could be used at this step include Model Architect, Saber, System Studio, and Design-Ware® products.

Logic design and functional verification (block 114): At this stage, high level description language (HDL) code, such as VHDL or Verilog code, is written for modules in the system and the design is checked for functional accuracy. More specifically, the design is checked to ensure that it produces the correct outputs in response to particular input stimuli. Example EDA software products that have been available from Synopsys, Inc. that can be used at this step include VCS, VERA, DesignWare®, Magellan, Formality, ESP and LEDA products.

Synthesis and design for test (block 116): Here, the VHDL/Verilog code is translated to a netlist. The netlist can be optimized for the target technology. Additionally, the design and implementation of tests to permit checking of the finished chip occur. Example EDA software products that have been available from Synopsys, Inc. that could be used at this step include Design Compiler®, Physical Compiler, Test Compiler, Power Compiler, FPGA Compiler, Tetra-MAX, and DesignWare® products.

Netlist verification (block 118): At this step, the netlist is checked for compliance with timing constraints and for correspondence with the VHDL/Verilog source code. Example EDA software products that have been available from Synopsys, Inc. that can be used at this step include Formality, PrimeTime, and VCS products.

Design planning (block 120): Here, an overall floor plan for the chip is constructed and analyzed for timing and top-level routing. Example EDA software products that have been available from Synopsys, Inc. that can be used at this step include Astro and IC Compiler products.

Physical implementation (block 122): The placement (positioning of circuit elements) and routing (connection of the same) occurs at this step. Example EDA software products that have been available from Synopsys, Inc. that can be used at this step include AstroRail, Primetime, and Star RC/XT products.

Analysis and extraction (block 124): At this step, the circuit function is verified at a transistor level; this in turn permits what-if refinement. Example EDA software products that have been available from Synopsys, Inc. that can be used at this stage include Custom Designer, AstroRail, PrimeRail, Primetime, and Star RC/XT products.

Physical verification (block 126): At this stage various checking functions are performed to ensure correctness for: manufacturing, electrical issues, lithographic issues, and circuitry. Example EDA software products that have been available from Synopsys, Inc. that can used at this stage include the Hercules product.

Tape-out (block 127): This stage provides the "tape-out" data for production of masks for lithographic use to produce finished chips. Example EDA software products that have been available from Synopsys, Inc. that can be used at this stage include the CATS(R) family of products.

Resolution enhancement (block 128): This stage involves geometric manipulations of the layout to improve manufacturability of the design. Example EDA software products that have been available from Synopsys, Inc. that can be used at this stage include Proteus/Progen, ProteusAF, and PSMGen products.

Mask preparation (block 130): This stage includes both mask data preparation and the writing of the masks themselves. Example EDA software products that have been available from Synopsys, Inc. that can be used at this stage include CATS(R) family of products.

The integrated circuit manufacturing flow includes a parallel flow, as follows:

(1) Develop individual process steps for manufacturing the integrated circuit. This can be modeled with the Synopsys tools "Sentaurus Process", "Sentaurus Topography", and "Sentaurus Lithography". The input information here is the process conditions like temperature, reactor ambient, implant energy, etc. The output information is the change in geometry or doping profiles or stress distribution.

(2) Integrate the individual process steps into the complete process flow. This can be modeled with the Synopsys tool "Sentaurus Process". The input information here is the collection of the process steps in the appropriate sequence. The output is the geometry, the doping profiles, and the stress distribution for the transistors and the space in between the transistors.

(3) Analyze performance of the transistor manufactured with this process flow. This can be done with the Synopsys tool "Sentaurus Device". The input information here is the output of step (3) and the biases applied to transistor terminals. The output information is the currents and capacitances for each bias combination.

(4) If necessary, modify the process steps and the process flow to achieve the desired transistor performance. This can be done iteratively by using the Synopsys tools mentioned above.

Once the process flow is ready, it can be used for manufacturing multiple circuit designs coming from different fabless companies. The EDA flow can be used by such fabless companies. The parallel flow described here is used at a foundry to develop a process flow that can be used to manufacture designs coming from their fabless customers. A combination of the process flow and the masks are used to manufacture any particular circuit. If the integrated circuit is manufactured at an IDM (integrated device manufacturer) company instead of the combination of a fabless company and a foundry, then both parallel flows described above are done at the same IDM company.

There is also a bridge between these tools and the EDA tools. The bridge is a Synopsys tool "Seismos" that applies compact proximity models for particular circuit design and layout to obtain netlist with instance parameters for each individual transistor in the circuit as a function of its neighborhood and stress, including material conversion stress. This netlist is used in the analysis step.

Figures 2A, 2B, 2C:
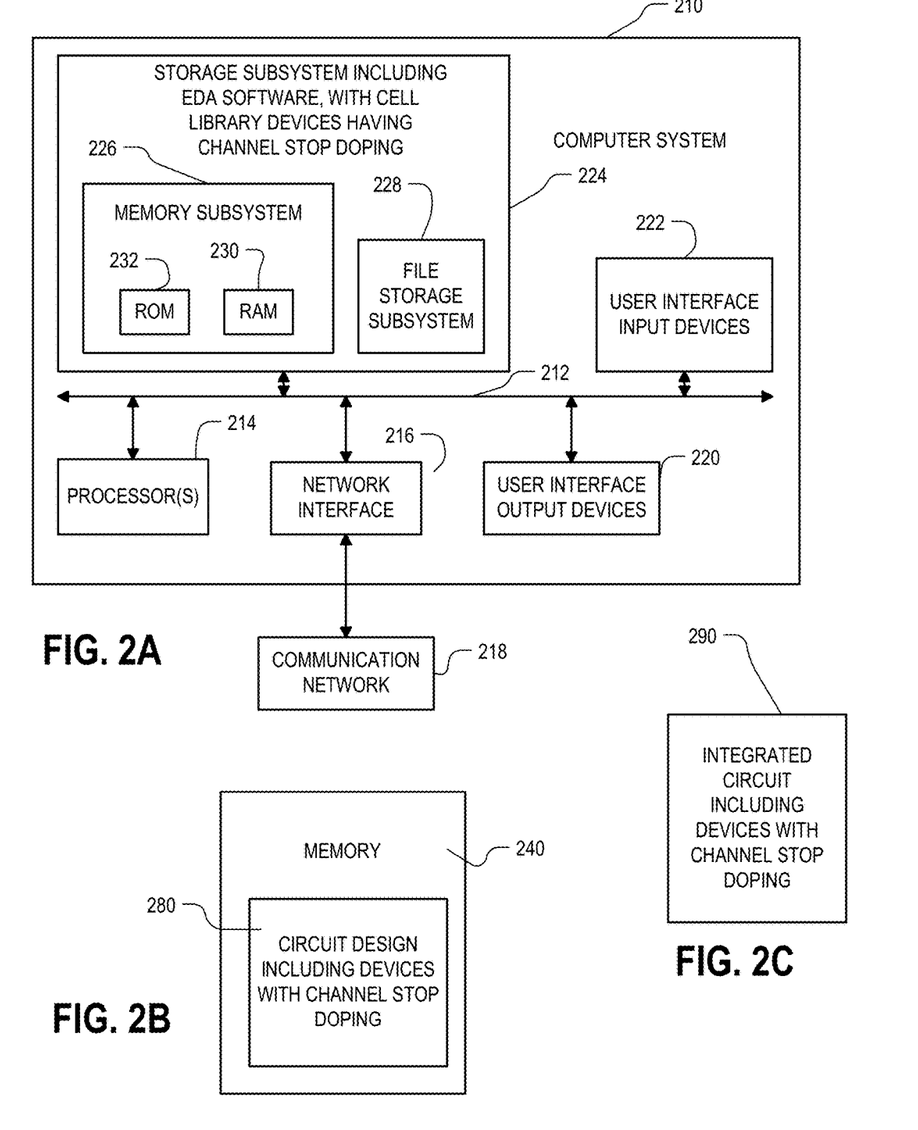
FIG. 2A is a simplified block diagram of a computer system that can be used to implement software incorporating aspects of the technology.
FIG. 2B is a memory that can be used to implement aspects of the technology.
FIG. 2C is an integrated circuit created with the described technology.

FIG. 2A is a simplified block diagram of a computer system 210 suitable for use with embodiments of the technology. Computer system 210 typically includes at least one processor 214 which communicates with a number of peripheral devices via bus subsystem 212. These peripheral devices may include a storage subsystem 224, comprising a memory subsystem 226 and a file storage subsystem 228, user interface input devices 222, user interface output devices 220, and a network interface subsystem 216. The input and output devices allow user interaction with computer system 210. Network interface subsystem 216 provides an interface to outside networks, including an interface to communication network 218, and is coupled via communication network 218 to corresponding interface devices in other computer systems. Communication network 218 may comprise many interconnected computer systems and communication links. These communication links may be wireline links, optical links, wireless links, or any other mechanisms for communication of information. While in one embodiment, communication network 218 is the Internet, communication network 218 may be any suitable computer network.

User interface input devices 222 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 210 or onto communication network 218.

User interface output devices 220 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 210 to the user or to another machine or computer system.

Storage subsystem 224 stores the basic programming and data constructs that provide the functionality of some or all of the EDA tools described herein, including cell library devices having channel stop doping and tools applied for development of a layout using the library and corresponding manufacturing. These software modules are generally executed by processor 214.

Memory subsystem 226 typically includes a number of memories including a main random access memory (RAM) 230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 228.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Computer system 210 itself can be of varying types including a personal computer, a portable computer, a workstation, a computer terminal, a network computer, a television, a mainframe, or any other data processing system or user device. Due to the ever-changing nature of computers and networks, the description of computer system 210 depicted in FIG. 2A is intended only as a specific example for purposes of illustrating the preferred embodiments.

Many other configurations of computer system 210 are possible having more or less components than the computer system depicted in FIG. 2A.

FIG. 2B shows a memory 240 such as a non-transitory, computer readable data storage medium associated with file storage subsystem 228, and/or with network interface subsystem 216 can include a data structure specifying a circuit design that includes cell library devices having channel stop doping. The memory 240 can be a hard disk, a floppy disk, a CD-ROM, an optical medium, removable media cartridge, or other medium that stores computer readable data in a volatile or non-volatile form. The memory 240 is shown storing a circuit design 280 including, for example, an HDL description of a circuit design that includes one or more cell library devices having channel stop doping. FIG. 2C is a block representing an integrated circuit 290 created with the described technology that includes one or more cell library devices having channel stop doping.

Figure 3A:
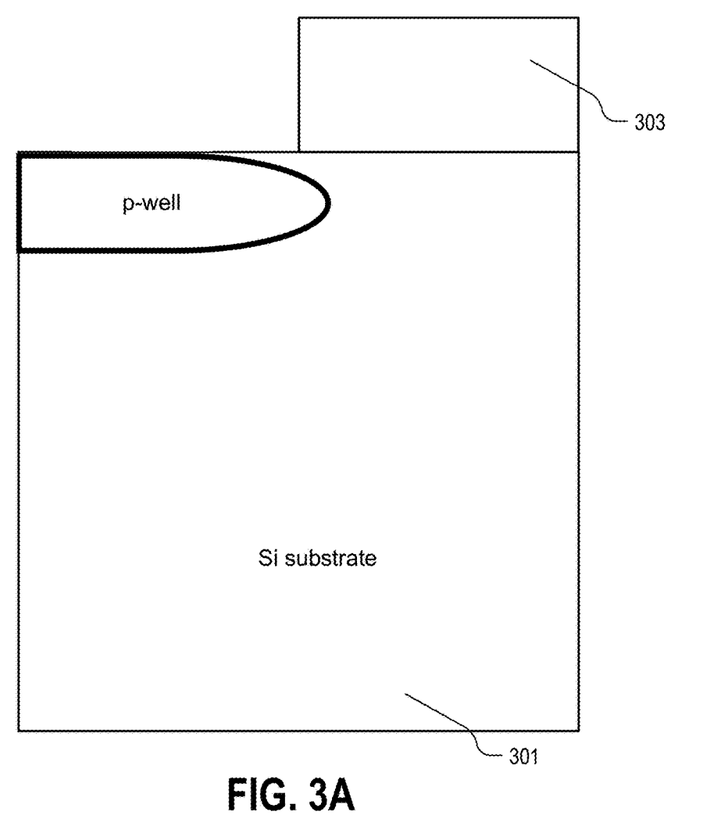
FIG. 3A shows mid-energy implants of p-type dopants such as boron into the silicon substrate.

FIG. 3A shows mid-energy implants of p-type dopants such as boron into the silicon substrate 301. A photolithographically defined pattern of photoresist 303 determines ion implantation windows. The final resting position of the implants is shown as slightly impinging from the volume under the open windows, to the volume covered by the photoresist.

Figure 3B:
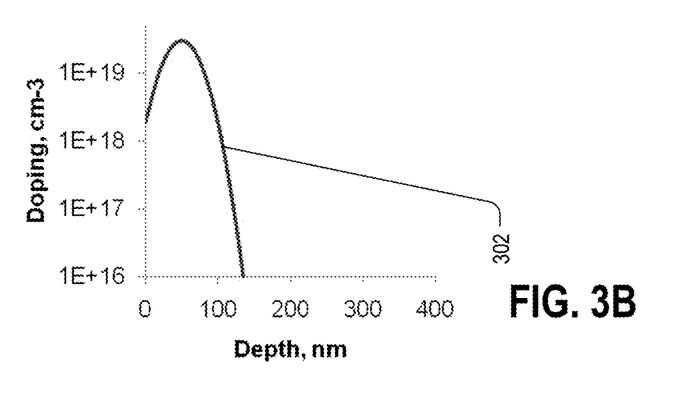
FIG. 3B is a doping graph that shows dopant implant depth versus dopant concentration with respect to FIG. 3A.

The doping graph 302 of FIG. 3B shows dopant implant depth versus dopant concentration. The implants are "mid-energy" in that neither ultra low energies like below 1 keV nor super high energies like above 500 keV are required. The doping concentration peak of over $10^{19}$ cm$^{-3}$ is below the surface of the silicon substrate 401, but shallower than 100 nm from the surface of the silicon substrate 301. The target dopant peak concentrations are in the range from $10^{17}$ cm$^{-3}$ to $10^{21}$ cm$^{-3}$. The target dopant peak depths are from zero to 500 nm from the surface.

Figure 4A:
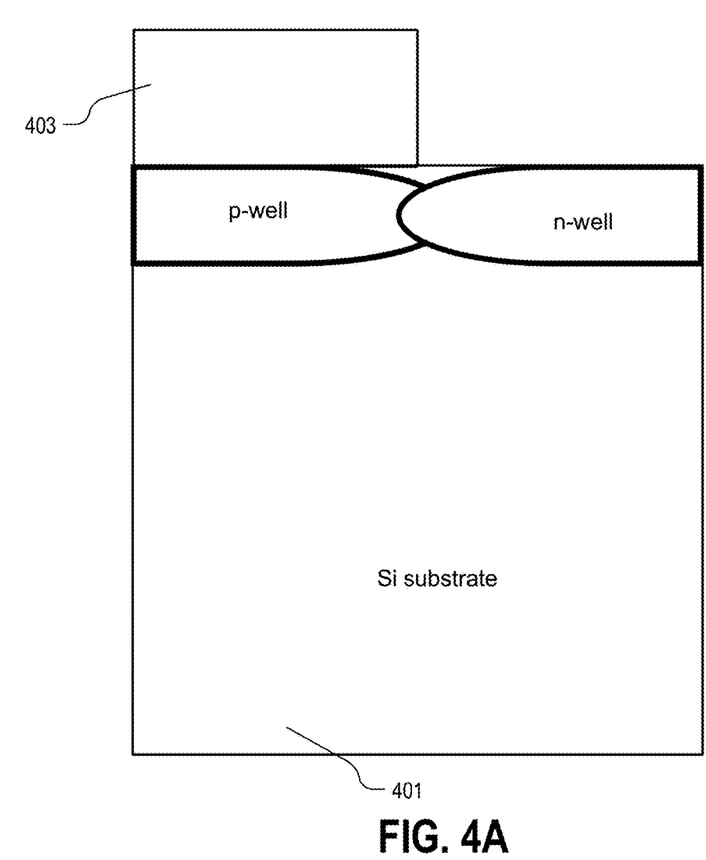
FIG. 4A shows mid-energy implants of n-type dopants such as phosphorus into the silicon substrate.

FIG. 4A shows mid-energy implants of n-type dopants such as phosphorus into the silicon substrate 401. A photolithographically defined pattern of photoresist 403 determines ion implantation windows. The final resting position of the implants is shown as slightly impinging from the volume under the open windows, to the volume covered by the photoresist.

Figure 4B:
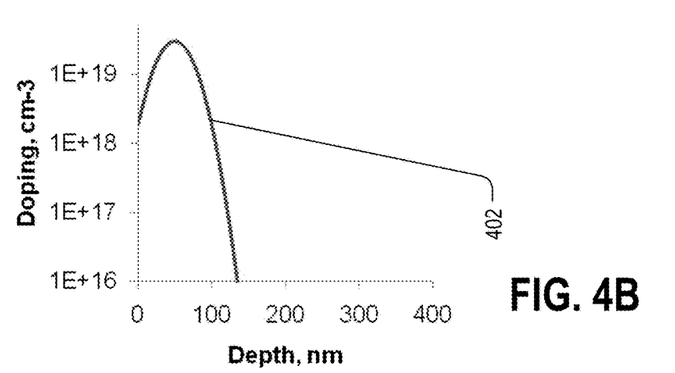
FIG. 4B is a doping graph that shows dopant implant depth versus dopant concentration with respect to FIG. 4A.

The doping graph 402 of FIG. 4B shows dopant implant depth versus dopant concentration. The implants are "mid-energy" in that neither ultra low energies like below 1 keV nor super high energies like above 500 keV are required. The doping concentration peak of over $10^{19}$ cm$^{-3}$ is below the surface of the silicon substrate 401, but shallower than 100 nm from the surface of the silicon substrate 401. The target dopant peak concentrations are in the range from $10^{17}$ cm$^{-3}$ to $10^{21}$ cm$^{-3}$. The target dopant peak depths are from zero to 500 nm from the surface.

Figure 5A:
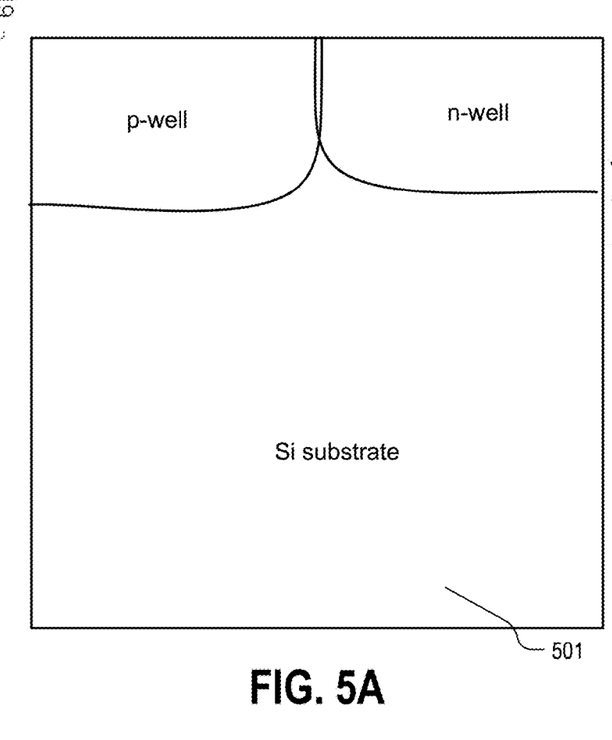
FIG. 5A shows the p-well and n-well formed from annealing and implantation of dopants.
Figure 5B:
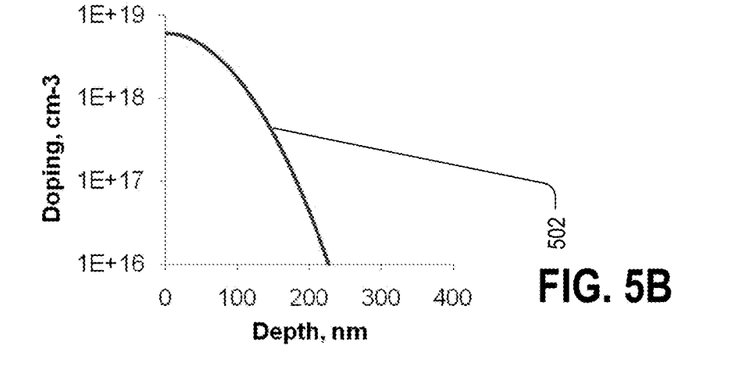
FIG. 5B is a doping graph that shows the dopant implant depth versus dopant concentration for the p-well with respect to FIG. 5A.
Figure 5C:
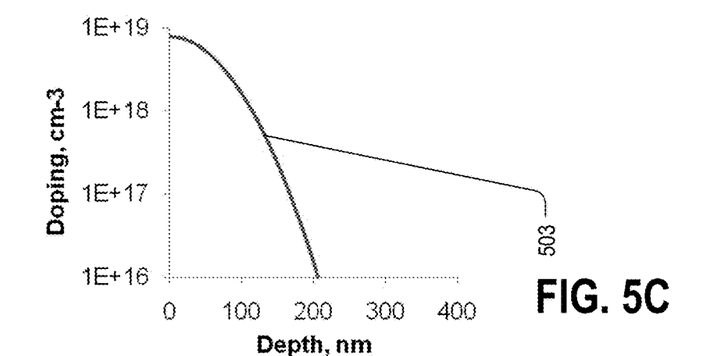
FIG. 5C is a doping graph that shows the dopant implant depth versus dopant concentration for the n-well with respect to FIG. 5A.
Figure 6A:
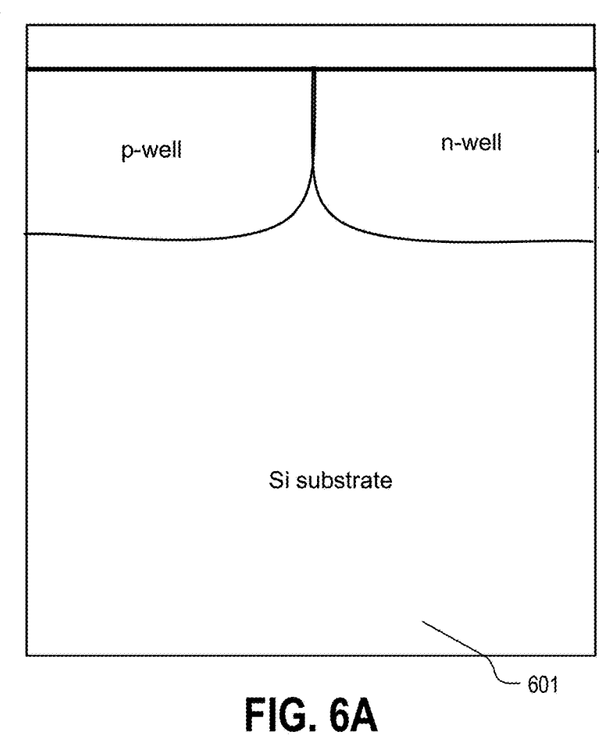
FIG. 6A shows epitaxial silicon above the p-well and n-well formed from annealing and implantation of dopants.
Figure 6B:
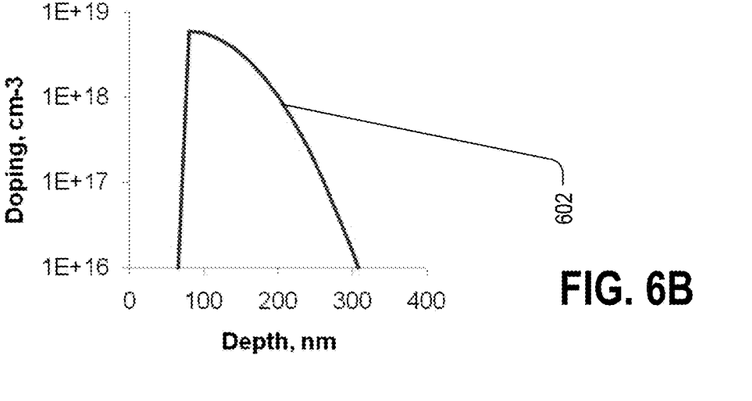
FIG. 6B is a doping graph that shows the dopant implant depth versus dopant concentration for the p-well with respect to FIG. 6A.
Figure 6C:
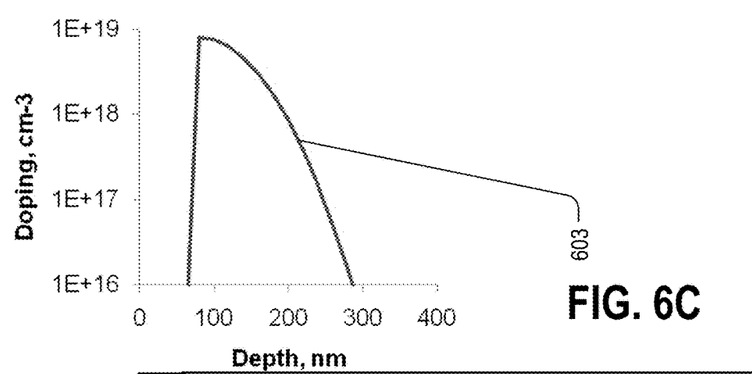
FIG. 6C is a doping graph that shows the dopant implant depth versus dopant concentration for the n-well with respect to FIG. 6A.

FIG. 5A shows the p-well formed from the implantation of p-type dopants, and the n-well formed after the implantation of n-type dopants, after annealing to activate the implants and to sharpen the junctions. The doping graphs 502 of FIG. 5B and 503 of FIG. 5C show the dopant implant depth versus dopant concentration, for the p-well and the n-well respectively. The doping concentration peak of over $10^{19}$ cm$^{-3}$ has decreased to less than $10^{19}$ cm$^{-3}$, and moved to the surface of the silicon substrate 501. The target dopant peak concentrations are in the range from $10^{17}$ cm$^{-3}$ to $10^{21}$ cm$^{-3}$. The target dopant peak depth is zero although it can be conceivably located within several tens or hundreds of nanometers from the surface. FIG. 6A shows the growth of epitaxial silicon on the surface of both the p-well and the n-well. The doping graphs 602 of FIG. 6B and 603 of FIG. 6C show the dopant implant depth versus dopant concentration, for the p-well and the n-well respectively. The preferred thickness range is determined by the height of the fin channel, which is typically 5 nm to 40 nm tall. The doping concentration peak was positioned at the surface of the silicon substrate after the prior step. Accordingly, following the growth of epitaxial silicon, there is an abrupt junction in the doping concentration between the epitaxial layer and the p-well and n-well. At the interface, the doping concentration changes by a decade over a depth of less than 3 nm. The doping concentration profiles from the previous step have shifted downward by a distance corresponding to the thickness of the epitaxial silicon.

Figure 7A:
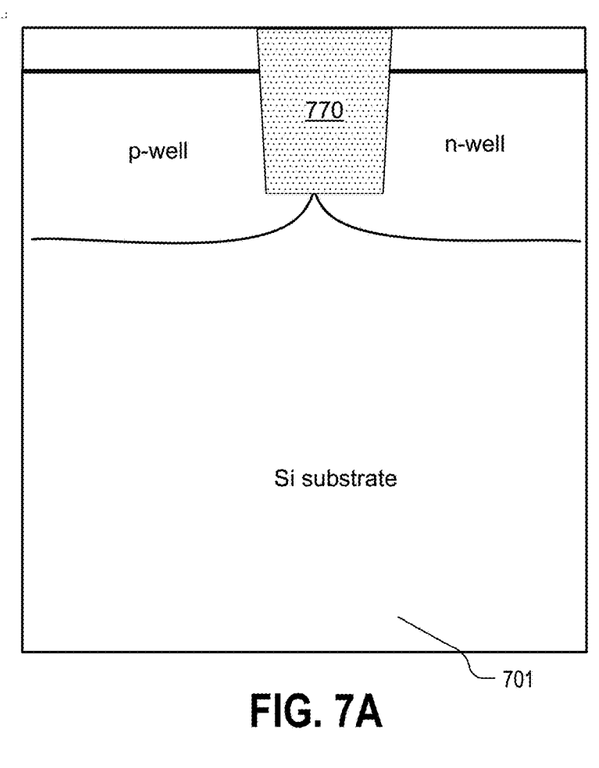
FIG. 7A shows the formation of shallow trench isolation (STI) regions in between the p-well and the n-well.
Figure 7B:
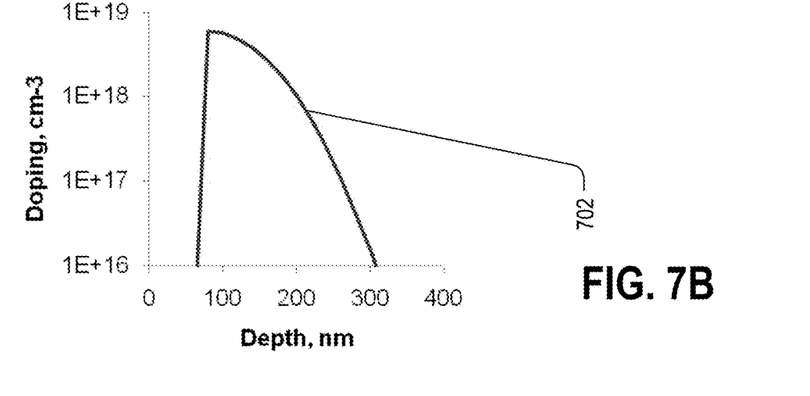
FIG. 7B is a doping graph that shows the dopant implant depth versus dopant concentration for the p-well with respect to FIG. 7A.
Figure 7C:
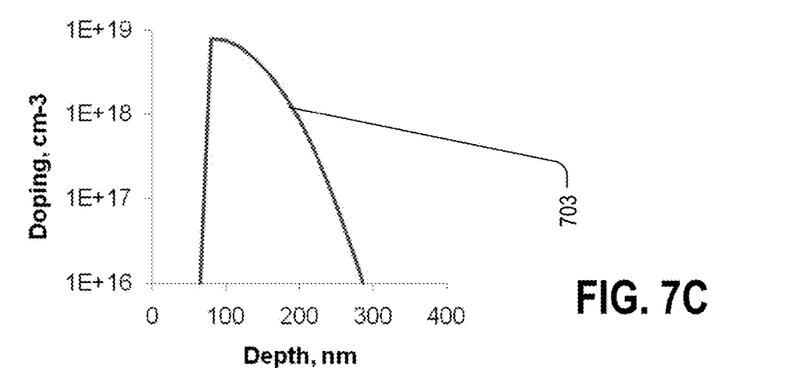
FIG. 7C is a doping graph that shows the dopant implant depth versus dopant concentration for the n-well with respect to FIG. 7A.

FIG. 7A shows the formation of shallow trench isolation (STI) regions in between the p-well and the n-well. The resulting epitaxial surface is used to form the transistor channels in finFETs or planar transistors. The doping graphs 702 of FIG. 7B and 703 of FIG. 7C show the dopant implant depth versus dopant concentration, for the p-well and the n-well respectively.

Figure 8:
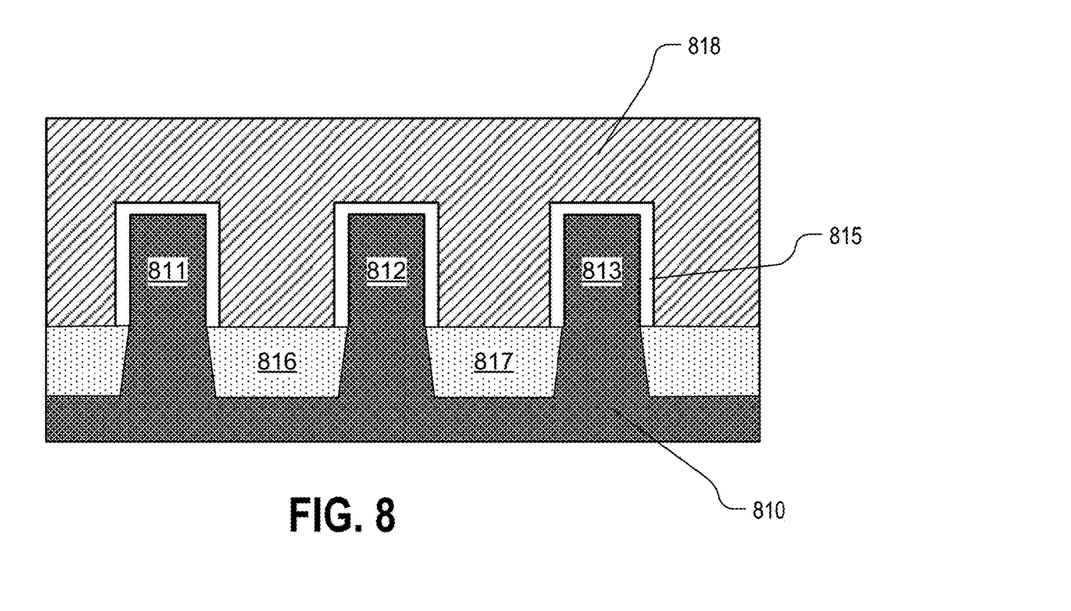
FIG. 8 is a cross-section of finFET transistors, where the fin structures of the finFET transistors have been made according to the process flow of FIGS. 1-5.

FIG. 8 is a simplified illustration showing finFET structures in a typical bulk substrate configuration. In FIG. 8, a plurality of fins 811, 812, 813 protrude from a bulk semiconductor body 810, sometimes referred to as body-tied fins. In addition, the individual fins are separated by shallow trench isolation structures 816, 817. A gate dielectric layer 815 overlies the fins 811, 812, 813. A gate conductor 818 extends across the fins and over the gate dielectric layer 815.

For the embodiment of FIG. 8, on either side of the gate conductor 818, source and drain regions (not shown) are implemented in the fins. The FET transistors that result have source, channel and drain regions in the fins, and a gate overlying the fins. Such transistors are often called multi-gate transistors, because the gate conductor overlies two sides of the fins, and as a result increases the effective width of the channel. The fins used to implement the finFET transistors can be quite narrow. For example, fins having widths on the order of 20 nm or less can be utilized. As a result of the multi-gate gate structure and the narrow widths of the fins, finFET transistors have excellent performance characteristics and small layout areas.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of performing channel stop doping in an integrated circuit, comprising:

implanting a first part of a surface of a semiconductor substrate with n-type dopants and a second part of the surface with p-type dopants;

making epitaxial semiconductor material directly on the first part of the surface implanted with the n-type dopants and on the second part of the surface implanted with the p-type dopants, the epitaxial semiconductor material having a dopant concentration on the first part of the surface and on the second part of the surface, the dopant concentration changing by a decade over a depth of less than 3 nanometers at an interface between the epitaxial semiconductor material and the semiconductor substrate under process conditions including temperature developed to cause the dopant concentration changing at the interface; and making a transistor with a transistor channel in the epitaxial semiconductor material, such that the transistor channel, in the epitaxial semiconductor material, of the transistor remains essentially undoped throughout manufacture of the integrated circuit.

2. The method of claim 1, wherein the implanted dopants provide latchup protection of the transistor against other structures.

3. The method of claim 1, wherein the transistor is one of a plurality of transistors with the transistor channel in the epitaxial semiconductor material, and the transistor channels of the plurality of transistors all remain essentially undoped throughout manufacture of the integrated circuit.

4. A nontransitory computer readable medium with computer executable instructions determining a layout of an integrated circuit design, the computer executable instructions including:
   first computer executable instructions defining first layout locations for implanting a first part of a surface of a semiconductor substrate with n-type dopants and a second part of the surface with p-type dopants; and
   second computer executable instructions defining second layout locations for making a transistor with a transistor channel in epitaxial semiconductor material, the epitaxial semiconductor material directly on the first part of the surface implanted with the n-type dopants and on the second part of the surface implanted with the p-type dopants, the epitaxial semiconductor material having a dopant concentration on the first part of the surface and on the second part of the surface, the dopant concentration changing by a decade over a depth of less than 3 nanometers at an interface between the epitaxial semiconductor material and the semiconductor substrate under process conditions including temperature developed to cause the dopant concentration changing at the interface, such that the transistor channel, in the epitaxial semiconductor material, of the transistor remains essentially undoped throughout manufacture of the integrated circuit.

5. The medium of claim 4, wherein the implanted dopants provide latchup protection of the transistor against other structures.

6. The medium of claim 4, wherein the transistor is one of a plurality of transistors with the transistor channel in the epitaxial semiconductor material, and the transistor channels of the plurality of transistors all remain essentially undoped throughout manufacture of the integrated circuit.

7. The medium of claim 4, wherein the computer executable instructions include:
   third computer executable instructions defining third layout locations for making the epitaxial semiconductor material directly on the first part of the surface implanted with the n-type dopants and on the second part of the surface with the p-type dopants.

8. A set of lithographic masks determining a layout of an integrated circuit design,
   including:
   a first lithographic mask defining first layout locations for implanting a first part of a surface of a semiconductor substrate with dopants and a second part of the surface with p-type dopants, resulting in a junction between the first and second parts having implants impinging from one of the first and second parts to another of the first and second parts; and
   a second lithographic mask defining second layout locations for making a transistor with a transistor channel in epitaxial semiconductor material, the epitaxial semiconductor material directly on the first part of the surface implanted with the n-type dopants and on the second part of the surface implanted with the p-type dopants, the epitaxial semiconductor material having a dopant concentration on the first part of the surface and on the second part of the surface, the dopant concentration changing by a decade over a depth of less than 3 nanometers at an interface between the epitaxial semiconductor material and the semiconductor substrate under process conditions including temperature developed to cause the dopant concentration changing at the interface, such that the transistor channel, in the epitaxial semiconductor material, of the transistor remains essentially undoped throughout manufacture of the integrated circuit.

9. The masks of claim 8, wherein the implanted dopants provide latchup protection of the transistor against other structures.

10. The masks of claim 8, wherein the transistor is one of a plurality of transistors with the transistor channel in the epitaxial semiconductor material, and the transistor channels of the plurality of transistors all remain essentially undoped throughout manufacture of the integrated circuit.

11. The masks of claim 8, wherein the set of lithographic masks include:
    a third lithographic mask defining third layout locations for making the epitaxial semiconductor material directly on the first part of the surface implanted with the n-type dopants and on the second part of the surface with the p-type dopants.

12. A computer system for laying out an integrated circuit design, the computer system comprising a processor and a memory,
    the computer system generating a layout of the integrated circuit design, the layout defining a plurality of masks, the computer system configured to perform computer executable instructions comprising:
    first computer executable instructions defining first layout locations for implanting a first part of a surface of a semiconductor substrate with n-type dopants and a second part of the surface with p-type dopants; and
    second computer executable instructions defining second layout locations making a transistor with a transistor channel in epitaxial semiconductor material, the epitaxial semiconductor material directly on the first part of the surface implanted with the n-type dopants and on the second part of the surface implanted with the p-type dopants, the epitaxial semiconductor material having a dopant concentration on the first part of the surface and on the second part of the surface, the dopant concentration changing by a decade over a depth of less than 3 nanometers at an interface between the epitaxial semiconductor material and the semiconductor substrate under process conditions including temperature developed to cause the dopant concentration changing at the interface, such that the transistor channel, in the epitaxial semiconductor material, of the transistor remains essentially undoped throughout manufacture of the integrated circuit.

13. The system of claim 12, wherein the implanted dopants provide latchup protection of the transistor against other structures.

14. The system of claim 12, wherein the transistor is one of a plurality of transistors with the transistor channel in the epitaxial semiconductor material, and the transistor channels of the plurality of transistors all remain essentially undoped throughout manufacture of the integrated circuit.

15. The system of claim 12, wherein the computer executable instructions include:
   third computer executable instructions defining third layout locations for making the epitaxial semiconductor material directly on the first part of the surface implanted with the n-type dopants and on the second part of the surface with the p-type dopants.

16. A method of performing channel stop doping in an integrated circuit, comprising:
   implanting a first part of a surface of a semiconductor substrate with n-type dopants and a second part of the surface with p-type dopants;
   epitaxially growing essentially undoped semiconductor material directly on the entire substrate surface, including both on the first part of the surface implanted with the n-type dopants and on the second part of the surface implanted with the p-type dopants, the epitaxially grown essentially undoped semiconductor material having a dopant concentration on the first part of the surface and on the second part of the surface, the dopant concentration changing by a decade over a depth of less than 3 nanometers at an interface between the epitaxially grown essentially undoped semiconductor material and the semiconductor substrate under process conditions including temperature developed to cause the dopant concentration changing at the interface;
   forming isolation trenches through the epitaxially grown undoped semiconductor material directly on the entire substrate surface and between the first part of the surface implanted with the n-type dopants and the second part of the surface implanted with the p-type dopants; and
   making a transistor with a transistor channel in the epitaxial semiconductor material, such that the transistor channel, in the epitaxial semiconductor material, of the transistor remains essentially undoped throughout manufacture of the integrated circuit.

17. The method of claim 16, wherein the transistor is one of a plurality of transistors with the transistor channel in the epitaxial semiconductor material, and the transistor channels of the plurality of transistors all remain essentially undoped throughout manufacture of the integrated circuit.

18. A nontransitory computer readable medium with computer executable instructions determining a layout of an integrated circuit design, the computer executable instructions including:
   first computer executable instructions defining first layout locations for implanting a first part of a surface of a semiconductor substrate with n-type dopants and a second part of the surface with p-type dopants;
   second computer executable instructions defining second layout locations for epitaxially growing essentially undoped semiconductor material directly on the entire substrate surface, including both on the first part of the surface implanted with the n-type dopants and on the second part of the surface implanted with the p-type dopants, the epitaxially grown essentially undoped semiconductor material having a dopant concentration on the first part of the surface and on the second part of the surface, the dopant concentration changing by a decade over a depth of less than 3 nanometers at an interface between the epitaxially grown essentially undoped semiconductor material and the semiconductor substrate under process conditions including temperature developed to cause the dopant concentration changing at the interface;
   third computer executable instructions defining third layout locations for forming isolation trenches through the epitaxially grown undoped semiconductor material directly on the entire substrate surface and between the first part of the surface implanted with the n-type dopants and the second part of the surface implanted with the p-type dopants; and
   fourth computer executable instructions defining fourth layout locations for making a transistor with a transistor channel in the epitaxial semiconductor material, such that the transistor channel, in the epitaxial semiconductor material, of the transistor remains essentially undoped throughout manufacture of the integrated circuit.

19. The nontransitory computer readable medium of claim 18, wherein the transistor is one of a plurality of transistors with the transistor channel in the epitaxial semiconductor material, and the transistor channels of the plurality of transistors all remain essentially undoped throughout manufacture of the integrated circuit.

20. A set of lithographic masks determining a layout of an integrated circuit design, including:
   a first lithographic mask defining first layout locations for implanting a first part of a surface of a semiconductor substrate with n-type dopants and a second part of the surface with p-type dopants;
   a second lithographic mask defining second layout locations for epitaxially growing essentially undoped semiconductor material directly on the entire substrate surface, including both on the first part of the surface implanted with the n-type dopants and on the second part of the surface implanted with the p-type dopants, the epitaxially grown essentially undoped semiconductor material having a dopant concentration on the first part of the surface and on the second part of the surface, the dopant concentration changing by a decade over a depth of less than 3 nanometers at an interface between the epitaxially grown essentially undoped semiconductor material and the semiconductor substrate under process conditions including temperature developed to cause the dopant concentration changing at the interface;
   a third lithographic mask defining third layout locations for forming isolation trenches through the epitaxially grown undoped semiconductor material directly on the entire substrate surface and between the first part of the surface implanted with the n-type dopants and the second part of the surface implanted with the p-type dopants; and
   a fourth lithographic mask defining fourth layout locations for making a transistor with a transistor channel in the epitaxial semiconductor material, such that the transistor channel, in the epitaxial semiconductor material, of the transistor remains essentially undoped throughout manufacture of the integrated circuit.

21. The set of lithographic masks of claim 20, wherein the transistor is one of a plurality of transistors with the transistor channel in the epitaxial semiconductor material, and the transistor channels of the plurality of transistors all remain essentially undoped throughout manufacture of the integrated circuit.

22. A computer system for laying out an integrated circuit design, the computer system comprising a processor and a memory,
   the computer system generating a layout of the integrated circuit design, the layout defining a plurality of masks, the computer system configured to perform computer executable instructions comprising:

first computer executable instructions defining first layout locations for implanting a first part of a surface of a semiconductor substrate with n-type dopants and a second part of the surface with p-type dopants;

second computer executable instructions defining second layout locations for epitaxially growing essentially undoped semiconductor material directly on the entire substrate surface, including both on the first part of the surface implanted with the n-type dopants and on the second part of the surface implanted with the p-type dopants, the epitaxially grown essentially undoped semiconductor material having a dopant concentration on the first part of the surface and on the second part of the surface, the dopant concentration changing by a decade over a depth of less than 3 nanometers at an interface between the epitaxially grown essentially undoped semiconductor material and the semiconductor substrate under process conditions including temperature developed to cause the dopant concentration changing at the interface;

third computer executable instructions defining third layout locations for forming isolation trenches through the epitaxially grown undoped semiconductor material directly on the entire substrate surface and between the first part of the surface implanted with the n-type dopants and the second part of the surface implanted with the p-type dopants; and fourth computer executable instructions defining fourth layout locations for making a transistor with a transistor channel in the epitaxial semiconductor material, such that the transistor channel, in the epitaxial semiconductor material, of the transistor remains essentially undoped throughout manufacture of the integrated circuit.

23. The computer system of claim 22, wherein the transistor is one of a plurality of transistors with the transistor channel in the epitaxial semiconductor material, and the transistor channels of the plurality of transistors all remain essentially undoped throughout manufacture of the integrated circuit.

* * * * *